(12) United States Patent
Tsuji et al.

(10) Patent No.: US 7,641,761 B2
(45) Date of Patent: Jan. 5, 2010

(54) APPARATUS AND METHOD FOR FORMING THIN FILM USING SURFACE-TREATED SHOWER PLATE

(75) Inventors: Naoto Tsuji, Tokyo (JP); Yukihiro Mori, Tokyo (JP); Tominori Yoshida, Tokyo (JP); Masami Suzuki, Tokyo (JP)

(73) Assignee: ASM Japan K.K., Tokyo (JP)

( * ) Notice: Subject to any disclaimer, the term of this patent is extended or adjusted under 35 U.S.C. 154(b) by 390 days.

(21) Appl. No.: 11/038,888

(22) Filed: Jan. 20, 2005

(65) Prior Publication Data

US 2005/0156063 A1 Jul. 21, 2005

(30) Foreign Application Priority Data

Jan. 21, 2004 (JP) ............... 2004-012826

(51) Int. Cl.
*C23F 1/00* (2006.01)
*H01L 21/306* (2006.01)
*C23C 16/00* (2006.01)

(52) U.S. Cl. .................... 156/345.34; 118/715
(58) Field of Classification Search ............ 156/345.34; 118/715
See application file for complete search history.

(56) References Cited

U.S. PATENT DOCUMENTS

| | | | | |
|---|---|---|---|---|
| 4,759,993 A * | 7/1988 | Pai et al. ............... 428/450 |
| 5,085,727 A * | 2/1992 | Steger ............... 156/345.47 |
| 5,449,410 A * | 9/1995 | Chang et al. ........... 118/723 ER |
| 5,788,799 A * | 8/1998 | Steger et al. ........... 156/345.37 |
| 6,193,803 B1 | 2/2001 | Sato et al. |
| 6,613,452 B2 * | 9/2003 | Weir ............... 428/652 |
| 6,625,862 B2 * | 9/2003 | Kajiyama et al. ............. 29/458 |
| 6,673,198 B1 * | 1/2004 | Wicker ............... 156/345.48 |
| 6,736,147 B2 | 5/2004 | Satoh et al. |
| 6,913,498 B1 * | 7/2005 | Sheth ............... 440/88 L |
| 2003/0097987 A1 | 5/2003 | Fukuda |
| 2003/0148035 A1* | 8/2003 | Lingampalli ............... 427/421 |

FOREIGN PATENT DOCUMENTS

| | | |
|---|---|---|
| JP | 61-260623 | 11/1986 |
| JP | 11-251094 | 9/1999 |
| JP | 2001-240973 A | 9/2001 |

* cited by examiner

*Primary Examiner*—Michael Cleveland
*Assistant Examiner*—Keath T Chen
(74) *Attorney, Agent, or Firm*—Knobbe Martens Olson & Bear LLP (57) ABSTRACT

A plasma CVD apparatus includes a showerhead comprised of a body having a hollow structure. The shower plate is detachably integrated with the body at a peripheral surface of the body and a peripheral surface of the shower plate, and at least one of the peripheral surface of the body or the peripheral surface of the shower plate is surface-treated.

6 Claims, 7 Drawing Sheets

Background Art

FIG. 1(A)

Background Art

APPARATUS AND METHOD FOR FORMING THIN FILM USING SURFACE-TREATED SHOWER PLATE

BACKGROUND OF THE INVENTION

1. Field of the Invention

The present invention generally relates to a thin-film forming apparatus using plasma CVD method and a method for forming thin films; and particularly to a thin-film forming apparatus and method which form thin films using a surface-treated shower plate.

2. Description of the Related Art

Figure 1A:
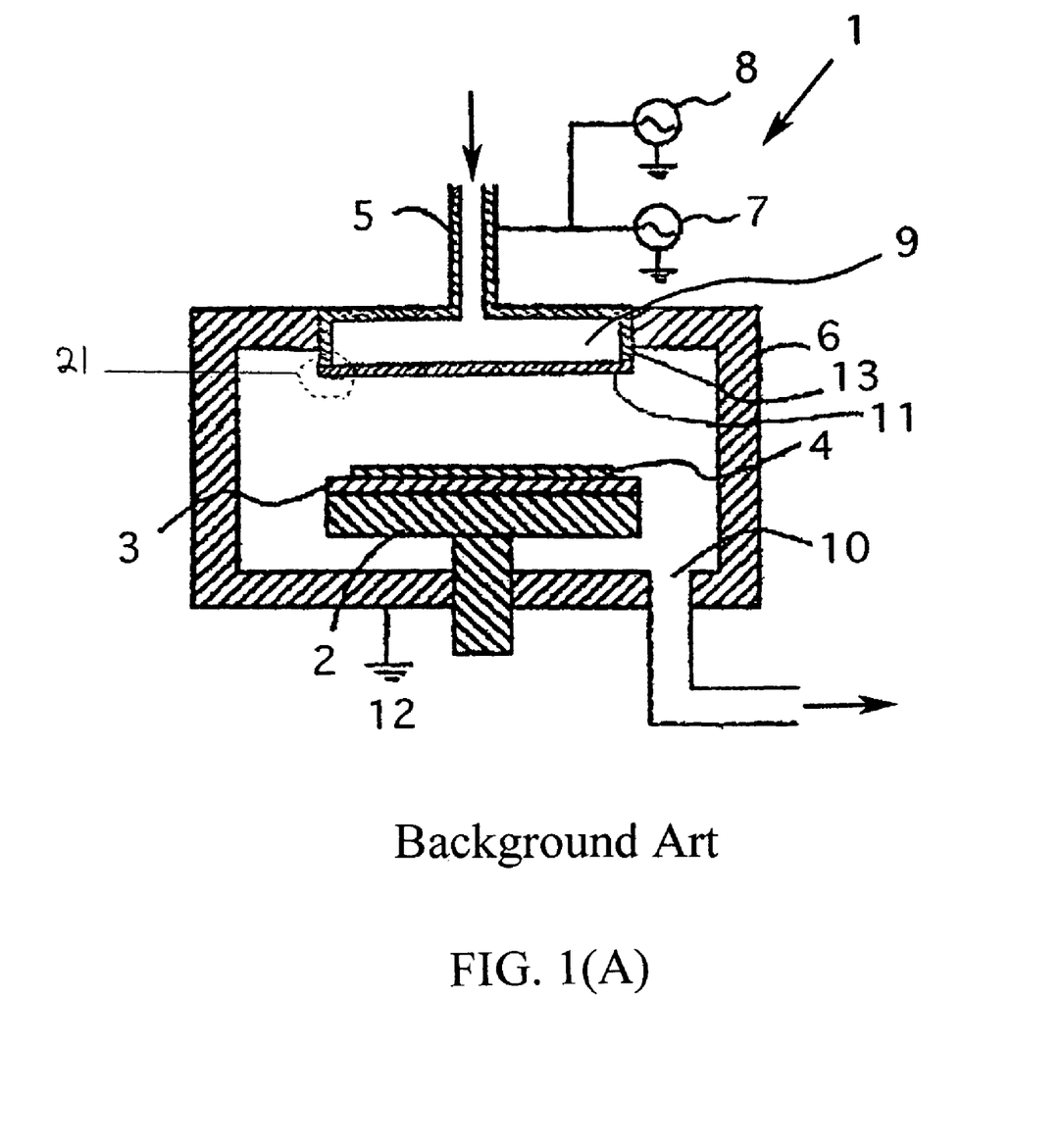
FIG. 1(A) is a schematic cross-section of a conventional thin-film forming apparatus.

The plasma CVD method has been typically used as a method for forming a thin film on a semiconductor substrate. FIG. 1 is a schematic view of a conventional plasma CVD deposition apparatus 1. The plasma CVD apparatus 1 comprises a reaction chamber 6, a susceptor 3 for placing a semiconductor substrate 4 inside the reaction chamber, a showerhead 9 provided over against and practically parallel to the susceptor 3 inside the reaction chamber, and an exhaust port 10 provided at the bottom of the reaction chamber. The susceptor 3 is supported by a heater 2 which heats the substrate 4 to a given temperature (150-450° C.) and is electrically grounded 12 so as to form one side of electrodes for plasma discharge. The showerhead 9 has a hollow structure in which a circular shower plate 11 having a number of fine pores is installed in a cylindrical body 13; a gas inlet port 5 for introducing a reaction gas is provided at the top of the showerhead 9. The showerhead 9 and the gas inlet port 5 are insulated from the reaction chamber 6, are connected with radio-frequency sources 7, 8 and form the other side of the electrodes. Such conventional plasma CVD apparatuses have been universally known, for example, as described in Japanese Patent Laid-open No. 1986-260623, Japanese Patent Laid-open No. 1999-251094, and Japanese Patent Laid-open No. 2001-240973.

A film type and film characteristics to be formed on a surface of the semiconductor substrate 4 change depending on the type and the flow rate of a reaction gas, the substrate temperature, the shower plate temperature, the type of RF frequency, and the spatial distribution and electric potential distribution of plasma. In order to remove a film formed on places other than the substrate, a cleaning process is executed in the conventional plasma CVD apparatus after a consecutive deposition process for a given number of substrates has been completed. According to circumstances, a cleaning process may be executed whenever a deposition process for one piece of substrate is completed.

As described above, the conventional showerhead 9 has a hollow structure and a jet of reaction gas is emitted uniformly from the fine pores (not shown) in the shower plate 11. In order to facilitate maintenance and to reduce component costs, the showerhead 9 has a structure where the shower plate 11 is replaceable. Metal (aluminum or aluminum alloy) surfaces to be connected are exposed on both the shower plate 11 side and the body 13 side, and the two sides are then attached firmly and fixed by bolts, etc.

Figure 1B:
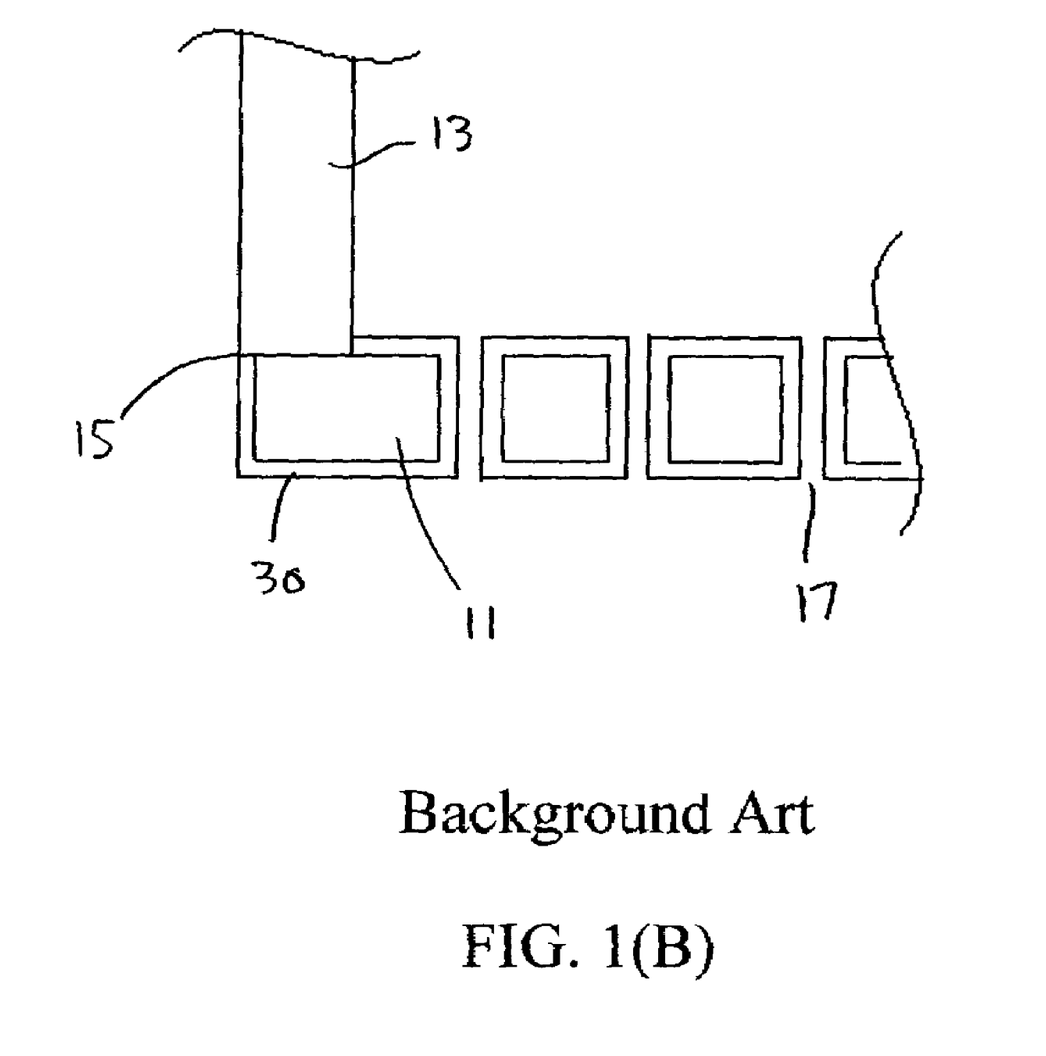

Conventionally, the surfaces of the body and the shower plate are in metal-to-metal contact in order to prevent interference with passage of electric current and propagation of radio-frequency waves. Further, no special protection is believed to be required because the surfaces are not fully exposed to fluorinated radicals. This is true even when a surface of the shower plate is anodized. FIG. 1(B) is an enlarged view of an integrated portion 21 of the body 13 and the shower plate 11. A surface of the conventional shower plate including pores 17 is coated with an anodic oxide layer 30, except for a peripheral surface 15 which is in metal-to-metal contact with a peripheral surface 14 of the body. It is commonly known in the art that it is needless to say that the peripheral surface 15 is exposed.

SUMMARY OF THE INVENTION

However, when the deposition process was executed consecutively using a conventional plasma CVD apparatus, there were problems in that film characteristics of a thin film deposited changed. Specifically, changes in film characteristics, i.e., an increased film thickness and a reduced elastic modulus, were observed as described later. Such problems are extremely serious for high integration of devices and cannot be tolerated as they damage the reliability of the devices. After investigating the causes of the problems, several rough corroded portions were found on the contact surfaces of the shower plate 11 and the body 13 (more corrosion spots were observed on the contact surface of the body 13 than on the contact surface of the shower plate). As a result of elemental analysis of the portions in question, it was found that the portions were considerably fluorinated.

The metal contact surfaces on both the shower-plate side and the body side are being exposed although they are in contact during the cleaning process, electric current is applied therebetween, and the shower plate is more heated than the body. In view of the above, corrosion of the metal contact surfaces may be corrosion caused by fluorinated radicals used in a cleaning process, galvanic corrosion, or abrasion due to different thermal expansions of the body and the shower plate, or any combination of the foregoing. In any event, as a result of executing the consecutive deposition process, film characteristics change as corrosion of the contact surfaces progresses and hence heat conduction between the body 13 and the shower plate 11 changes, thereby causing changes in a temperature of the shower plate over time or changes in radio frequency propagation from the body 13 to the shower plate 11 over time.

Consequently, in an embodiment of the present invention, an object is to provide a thin-film forming apparatus and method which are stable in the process where film characteristics do not change by the consecutive deposition process.

To solve the above-mentioned problems, in an aspect, the present invention provides a showerhead configured to be provided in a plasma CVD apparatus, comprising: (i) a body having a hollow structure; and (ii) a shower plate having a number of fine pores, wherein the shower plate is detachably integrated with the body at a peripheral surface of the body and a peripheral surface of the shower plate, at least one of the peripheral surface of the body or the peripheral surface of the shower plate is surface-treated.

In the above, by surface-treating at least one of the integrated peripheral surfaces of the body and the shower plate so as to eliminate metal-to-metal contact, even though the body and the shower plate are tightly secured at the integrated surfaces, effects of fluorinated radicals, for example, during a cleaning process of the reaction chamber (or galvanic corrosion or thermal abrasion or a combination of these) can effectively be controlled, and a deposition process can significantly be stabilized, thereby stabilizing characteristics of as-deposited films such as film thickness and elastic modulus. On the other hands, the surface-treated integrated surfaces typically do not interfere with passage of electric current or propagation of radio-frequency waves but reduce thermal conductivity (i.e., prevent the shower plate from defusing too much heat to the body).

In an embodiment, the surface-treated peripheral surface may be a surface which i) has corrosion resistance to fluorinated radicals, ii) does not interfere with propagation of radio-frequency waves, iii) lowers thermal conductivity from the shower plate to the body, and/or iv) is made of a material different from a material constituting the body or the shower plate itself. The surface-treated peripheral surface may be a surface satisfying criteria i) through iv) above.

The above aspect includes, but is not limited to, the following embodiments:

The surface-treated peripheral surface may be constituted by a coating having a thickness of about 1 µm to about 100 µm, depending on the formation method.

The surface-treated peripheral surface may be constituted by an anodic oxide layer, an aluminum fluoride coating, or a titanium nitride coating.

The peripheral surface of the body may be the surface-treated peripheral surface which is exclusively surface-treated in the body.

The body and the shower plate may be constituted by an aluminum alloy.

In another aspect, the present invention provides a plasma CVD apparatus comprising: (I) a reaction chamber; (II) a susceptor for placing a workpiece inside the reaction chamber and for serving as an electrode for plasma discharge; and (III) the showerhead of Claim 1 for introducing gas into the reaction chamber and for serving as another electrode for plasma discharge, said showerhead being disposed over against and substantially parallel to the susceptor inside the reaction chamber.

In all of the aforesaid embodiments, any element used in an embodiment can interchangeably be used in another embodiment unless such a replacement is not feasible or causes adverse effect. Further, the present invention can equally be applied to apparatuses and methods.

In still another aspect, the present invention provides a method for forming a thin film using a plasma CVD apparatus comprising (i) a reaction chamber; (ii) a susceptor; and (iii) a showerhead, said showerhead comprising (a) a body having a hollow structure and (b) a shower plate having a number of fine pores, said method comprising: (A) detachably integrating the shower plate with the body at a peripheral surface of the body and a peripheral surface of the shower plate, wherein at least one of the integrated peripheral surfaces of the body and the shower plate is surface-treated; (B) forming a thin film on a workpiece on the susceptor wherein a reaction gas is introduced into the reaction chamber through the shower plate via the body and radio-frequency power is applied between the susceptor and the showerhead; and (C) cleaning an inside of the reaction chamber with fluorinated radicals after completion of processing a give number of workpiece.

In yet another aspect, the present invention provides a method for forming a thin film by plasma CVD using the apparatus of Claim 10, comprising: (i) evacuating the reaction chamber; (ii) heating the workpiece placed on the susceptor to a given temperature; (iii) introducing a reaction gas into the evacuated reaction chamber; (iv) applying radio-frequency power to the showerhead to form a plasma reaction field in the vicinity of a surface of the workpiece; and (v) forming a thin film on the workpiece.

In the above, the thin film may be constituted by at least one selected from the group consisting of silicon nitride, silicon oxide, silicon oxide/nitride, low-dielectric-constant fluorine-doped silicon oxide, and low-dielectric-constant carbon-doped silicon oxide.

In all of the aforesaid embodiments, any element used in an embodiment can interchangeably be used in another embodiment unless such a replacement is not feasible or causes adverse effect.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein. Further, the present invention is not limited by the theories described above, and other theories may be applicable to the present invention.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 1(B) is a partially enlarged view of a relevant portion. The figure does not intend to proportionately show dimensions of each element but simply shows general configurations solely for illustrative purposes.

FIG. 2(B) is a partially enlarged view of a relevant portion. The figure does not intend to proportionately show dimensions of each element but simply shows general configurations solely for illustrative purposes.

Explanation of symbols used is as follows: 2: Heater; 3: Susceptor; 4: Semiconductor substrate; 5: Gas inlet port; 6: Reaction chamber; 7: Radio-frequency source; 8: Radio-frequency source; 9': Showerhead; 10: Exhaust port; 11: Shower plate; 12: Grounding; 13: Body; 14: Integrated surface on the body side; 15: Integrated surface on the shower-plate side; 16: Surface treatment; 17: Fine pore; 20: Thin-film forming apparatus; 21': Integrated portion.

DETAILED DESCRIPTION OF THE PREFERRED EMBODIMENT

As described above, in an embodiment of the present invention, a thin-film forming apparatus for forming a thin film on a workpiece by plasma CVD method comprises a reaction chamber, a susceptor for placing the workpiece inside the reaction chamber and for serving as one side of electrodes for plasma discharge, a showerhead disposed over against and practically parallel to the susceptor inside the reaction chamber, said showerhead comprising a body having a hollow structure and a shower plate having a number of fine pores and serving as the other side of electrodes for plasma discharge, and at least one radio-frequency source connected to the showerhead; and the apparatus is characterized in that the body and the shower plate are integrated by a given means and one side or both sides of the integrated surfaces are surface-treated.

In one aspect, the surface treatment is anodizing. For example, an oxide coating can be formed on a peripheral surface of a shower plate or a body by using the shower plate or the body as one of electrodes in an acid solution such as sulfuric acid or oxalic acid and applying a voltage between the electrodes. An oxide coating-depositing area can be controlled by covering other areas with a masking tape to prevent the areas from contacting the acid solution. The thickness of an anodic oxide coating may be about 2 µm to about 200 µm (including 5 µm, 10 µm, 20 µm, 50 µm, 100 µm, 150 µm, and ranges between any two numbers of the foregoing). In an embodiment, the entire surface of the shower plate can be anodized.

In a different aspect, the surface treatment is aluminum fluoride coating. For example, an aluminum fluoride coating such as AlN can be formed on a peripheral surface of a shower plate or a body such as Al by PVD (sputtering), CVD, or plasma spray coating. A coating-depositing area can be controlled by covering other areas with a mask. The thickness of aluminum fluoride coating by PVD or CVD may be about 1 µm to about 20 µm (including 2 µm, 5 µm, 10 µm, and ranges between any two numbers of the foregoing). The thickness of aluminum fluoride coating by plasma spray coating (although purity may be reduced due to the process pressure, i.e., atmospheric pressure) can be over 100 µm (including 10 µm, 50 µm, 100 µm, 150 µm, and ranges between any two numbers of the foregoing).

In another different aspect, the surface treatment is titanium nitride coating. For example, a titanium nitride coating such as TiN can be formed on a surface of a shower plate or a body such as Al by PVD (sputtering), CVD, or plasma spray coating. A coating-depositing area can be controlled by covering other areas with a mask. The thickness of aluminum fluoride coating by PVD or CVD may be about 1 µm to about 20 µm (including 2 µm, 5 µm, 10 µm, and ranges between any two numbers of the foregoing). The thickness of aluminum fluoride coating by plasma spray coating (although purity may be reduced due to the process pressure, i.e., atmospheric pressure) can be over 100 µm (including 10 µm, 50 µm, 100 µm, 150 µm, and ranges between any two numbers of the foregoing).

At least one of the peripheral surface of the shower plate or the peripheral surface of the body is surface-treated, and when both of the peripheral surfaces are surface-treated, the type of surface treatment for each surface can be the same or different.

By using the above coating, the surface-treated peripheral surface can be a surface which i) has corrosion resistance to fluorinated radicals, ii) does not interfere with propagation of radio-frequency waves, iii) lowers thermal conductivity from the shower plate to the body, and/or iv) is made of a material different from a material constituting the body or the shower plate itself. In an embodiment, only criteria i) and ii) above are met, satisfying functionality and stability of film formation. In an embodiment, criterion iv) is mainly for practical purposes. In an embodiment, criterion iii) is incidental or secondary. In an embodiment, all of the criteria are met.

Generally, the impedance of radio-frequency power is expressed by: Impedance $(\Omega)=1/\{2\pi\times\text{Frequency (Hz)}\times\text{Capacitance (F)}\}$. In an embodiment, because the product of the capacitance of the integrated portion (e.g., 1 nF) and the frequency of the RF source (e.g., 300 kHz-60 MHz, typically 10 MHz-30 MHz) is sufficiently large, the impedance becomes small and does not hinder RF propagation from the body to the shower plate. Consequently, an influence arising from the RF propagation can be ignored. In an embodiment, heat conduction between the body and the shower plate is greatly affected by the surface treatment. In that case, the surface treatment reduces thermal conductivity between the shower plate and the body, and prevents the shower plate from defusing too much heat to the body (this may be because the surface-treated surface is hard and may interfere with close contact with the other surface). The temperature of the conventional shower plate without surface treatment is normally about 50° C. higher than the temperature of the body. In an embodiment of the present invention, the shower plate may maintain a temperature which is about 30° C. to about 50° C. higher than the temperature of the conventional shower plate without surface treatment (i.e., about 80° C. to about 100° C. higher than the temperature of the body). As a result, the temperature of the shower plate rises, and film thicknesses can become thicker than those without surface treatment of the integrated surfaces. Because no corrosion may occur, film formation can be conducted with high stability of characteristics of as-deposited films. For example, the non-uniformity of thickness among films may be about ±1%, preferably about ±0.5%, and the non-uniformity of elastic modulus among films may be about ±2%, preferably about ±1% (under the conditions indicated in the Examples described later) where the non-uniformity is defined as $\pm(\text{Max}-\text{Min})/(\text{Max}+\text{Min})\times 100\%$.

In typical plasma CVD apparatuses, there is no metal-to-metal contact other than the integrated surfaces of the body and the shower plate in the inside the reaction chamber. All other parts are normally welded (e.g., U.S. Pat. No. 6,193,803, the disclosure of which is herein incorporated by reference in its entirety), and further, electric current may not be applied.

The body and the shower plate may be secured with bolts (e.g., 6-12 bolts). In an embodiment, bolts are inserted through holes provided in the shower plate and secured in screw holes provided in the body. The bolts may be made of nickel or nickel alloy having corrosion resistance to fluorinated radicals. Although the methods of attaching the shower plate to the body are not limited to the above, the shower plate is preferably detachable from the body. The "detachable" means that a peripheral surface of the body and a peripheral surface of the shower plate are not fused or welded or not molded as a one piece. The shower plate need not be practically replaceable.

A surface of the shower plate may typically be surface-treated such as anodizing (e.g., anodized aluminum coating). A peripheral surface of the shower plate to be integrated with a peripheral surface of the body can be surface-treated independently of the anodic treatment of another surface of the shower plate. A surface of the body may typically not be surface-treated, and in an embodiment, only the peripheral surface of the body to be integrated with the peripheral surface of the shower plate is surface-treated. In an embodiment, surface-treatment of the peripheral surface of the body is more effective than surface-treat of the peripheral surface of the shower plate in order to accomplish stability of consecutive film formation.

The body and the shower plate may be constituted by the same or different aluminum alloy compositions. Any suitable composition can be used including, but not limited to, those indicated in the Experiments described later.

In an embodiment, the apparatus provided with the body and the shower plate integrated at the peripheral surfaces of the body and the shower plate (at least one of them is surface-treated) is advantageous especially when a thin film is one selected from the group consisting of silicon nitride, silicon oxide (USG, BPSG, PSF, BSG, etc.), silicon oxide/nitride, low-dielectric-constant fluorine-doped silicon oxide, and low-dielectric-constant carbon-doped silicon oxide films.

In an embodiment, a method for forming a thin film by plasma CVD method using any of the thin film forming apparatus of the present invention can be performed by evacuating a reaction chamber, heating a workpiece (e.g., a semiconductor substrate) placed on a susceptor to a given temperature, introducing a reaction gas at a controlled flow rate into the evacuated reaction chamber, applying radio-frequency power at a given frequency to a showerhead so as to form a plasma reaction field in the vicinity of a surface of the workpiece, and forming a thin film on the workpiece. In the method, films can be formed consecutively, without changing film characteristics.

The present invention will be explained with respect to preferred embodiments. However, the present invention is not limited to the preferred embodiments.

Figure 2A:
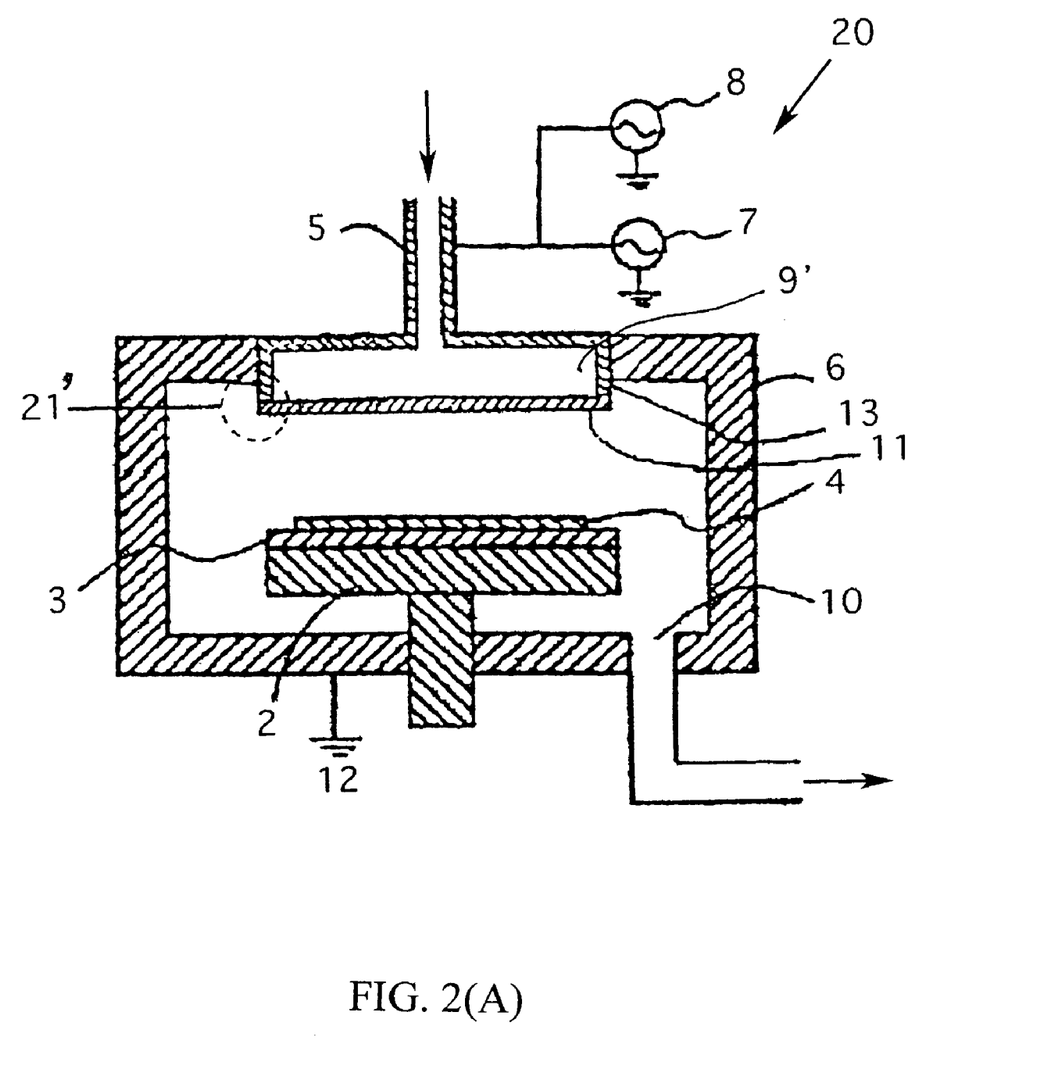
FIG. 2(A) is a schematic cross-section of the thin-film forming apparatus according to an embodiment of the present invention.
Figure 2B:
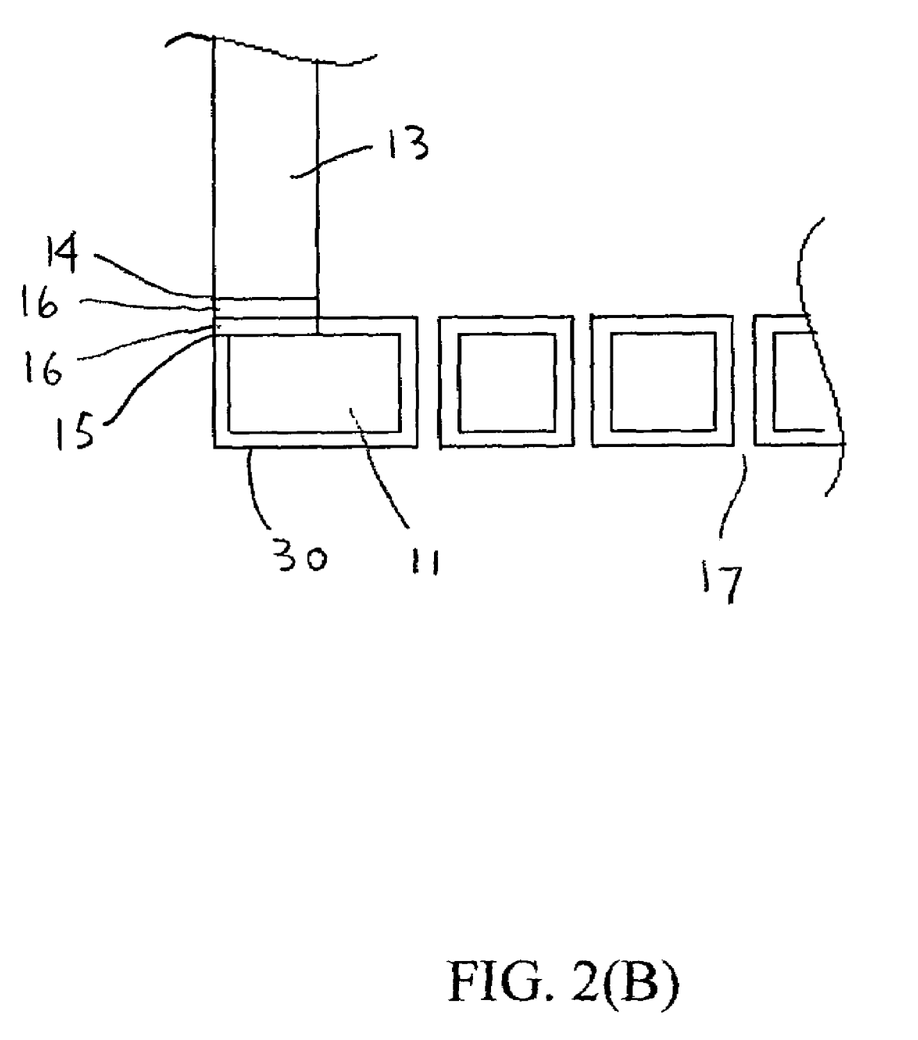

FIG. 2(A) is a schematic cross-section of the thin-film forming apparatus according to an embodiment of the present invention; FIG. 2(B) is an enlarged view of an area encircled by a broken line in FIG. 2(A).

The thin-film forming apparatus 20 according to this embodiment may have the same structure as the conventional thin-film forming apparatus 1 shown in FIG. 1(A) except for a showerhead 9'. The showerhead 9' comprises a cylindrical body 13 and a circular shower plate 11. The showerhead 9' according to this embodiment may be characterized by integrated portions of the body 13 and the shower plate 11. FIG. 2(B) is an enlarged view of the integrated portion 21' of the body 13 and the shower plate 11. In a preferred embodiment, a peripheral-edge surface 14 of the body 13 is surface-treated 16. Additionally, in the same way, a peripheral portion 15 of the shower plate 11 are also surface-treated 16. The shower plate need not be flat plate-like but can have a flange or peripheral convex portion to be attached to the body.

In another embodiment, it is acceptable that only one side of the peripheral-edge surface 14 or the peripheral portion 15 of the shower plate 11 is surface-treated 16. The body 13 and the shower plate 11 are integrated by an appropriate means including bolts.

In an embodiment, the surface treatment 16 applied is anodizing. In a different embodiment, the surface treatment 16 applied is aluminum fluoride coating. In another different embodiment, the surface treatment 16 applied is titanium nitride coating. Additionally, all kinds of surface treatments having corrosion resistance to fluorinated radicals which have been well known to one of ordinary skill in the art can be included in the aspects according to an embodiment of the present invention. In this embodiment, the remaining surface of the shower plate is coated with an anodic oxide layer 30 (e.g., anodized aluminum film). The surface treatment 16 applied on the peripheral portion 15 can be constituted by the same anodic oxide layer.

The method for forming a thin film using the thin-film forming apparatus according to an embodiment of the present invention is described below. The steps of the method comprises: (1) the inside of the reaction chamber 6 is evacuated by a vacuum pump (not shown); (2) a semiconductor substrate 4 is carried into the reaction chamber 6 via a gate valve (not shown) and is placed on the susceptor 3; (3) the semiconductor substrate 4 placed on the susceptor 3 is heated by a heater 2 to a given temperature (e.g., 150-450° C.); (4) a reaction gas with its flow rate controlled at a given value is introduced from the gas inlet port 5 into the reaction chamber.

The reaction gas used here differs according to a film type to be formed on a semiconductor substrate 4. When silicon nitride films are formed, silane as a silicon-containing source gas, and nitrogen and/or ammonia as a nitride gas may be used. When silicon oxide films are formed, silane or TEOS (tetraethylorthosilicate) as a silicon-containing source gas and an oxide gas (nitrous oxide when silane is used; oxygen when TEOS is used) may be used. Silicon oxide films referred to here are specifically USG, BPSG, PSG, BSG, etc. As a doping gas for silicon oxide films, diborane may be used if boron is used; phosphine may be used if phosphorus is used. When silicon oxide/nitride films are formed, silane as a silicon-containing source gas, and nitrogen and/or ammonia as a nitride gas, nitrous oxide as an oxide gas may be used. When low-dielectric-constant fluorine-doped silicon oxide films are formed, TEOS and CF4 may be used or nitrous oxide and SiF4 may be used. When low-dielectric-constant carbon-doped silicon oxide films are formed, silicon-containing carbon hydride containing multiple alkoxy groups, and Ar and/or He may be used; additionally, an oxide gas (one gas or a combination of gases selected from oxygen, nitrous oxide, carbon dioxide, alcohol, etc.) can be added. A jet of reaction gas can be emitted uniformly to the semiconductor substrate 4 from a number of fine pores 17 provided in the shower plate 11 via the internal hollow structure of the showerhead 9'.

Radio-frequency power at a given frequency is applied by radio-frequency sources 7, 8 to the showerhead 9' so as to form a plasma reaction field in the vicinity of a surface of the semiconductor substrate 4. Preferably, the first radio-frequency source 7 is at a frequency of 27.12 MHz and the second radio-frequency source 8 is at a frequency of 400 kHz. Frequencies of respective radio-frequency sources 7, 8 can be changed appropriately. Additionally, the radio-frequency sources 7, 8 can be used in combination, but can be used independently. Furthermore, radio-frequency power to be applied can be selected appropriately.

By a chemical reaction caused in the plasma reaction field, a desired thin film is deposited on the semiconductor substrate 4. Finally, the inside of the reaction chamber 6 is purged by an inert gas, etc. After the deposition process is completed on the prescribed number of semiconductor substrates, the cleaning process is executed. As mentioned above, fluorinated radicals are generally used in the cleaning process.

Cleaning Operation can be conducted in accordance with, for example, U.S. Pat. No. 6,736,147 to ASM Japan K.K. or U.S. Patent Publication No. 2003/97987 to ASM Japan K.K., the disclosure of which is herein incorporated by reference in its entirety. For example, a process may use the species NF3 with Ar at a temperature in the range of 20° C. to 800° C., and preferably 200° C. to 500° C. (e.g., 350° C.), and at a pressure compatible with a remote plasma generator working range (0.5 to 10 Torr, e.g., 5 Torr) in order to remove deposited layers formed of silicon, silicon nitride, silicon oxynitride and/or silicon dioxide. NF3 is dissociated when flowing through the remote plasma discharge chamber by applying between no less than 1,000 W but less than 3,000 W of radio frequency energy (e.g., 2700 W).

EXAMPLE

Details of film formation experiments conducted using the thin-film forming apparatus according to embodiments are described below. The present invention is not limited to these embodiments.

In the experiments, the consecutive deposition process of forming low-dielectric-constant carbon-doped silicon oxide films on semiconductor substrates was executed under the conditions described below, and changes in film characteristics (the film thickness and the elastic modulus) were measured. Φ300 mm silicon substrates were used in the film formation experiments and the cleaning process was executed whenever the deposition process for one piece of substrate was completed.

Deposition Condition:
Source gas: DM-DMOS (dimethyl-dimethoxysilane) 200 sccm
Additive gas: He 200 sccm
Substrate temperature: 350° C.
Pressure: 4 Torr
RF source: 27.12 MHz, 3.5 W/cm2
Cleaning conditions: An NF3 flow of 1 slm, an Ar flow of 2 slm, a chamber pressure of 670 Pa, a remote plasma source power of 2.7 kW, a susceptor temperature of 350° C.

Experiment 1

Figure 3:
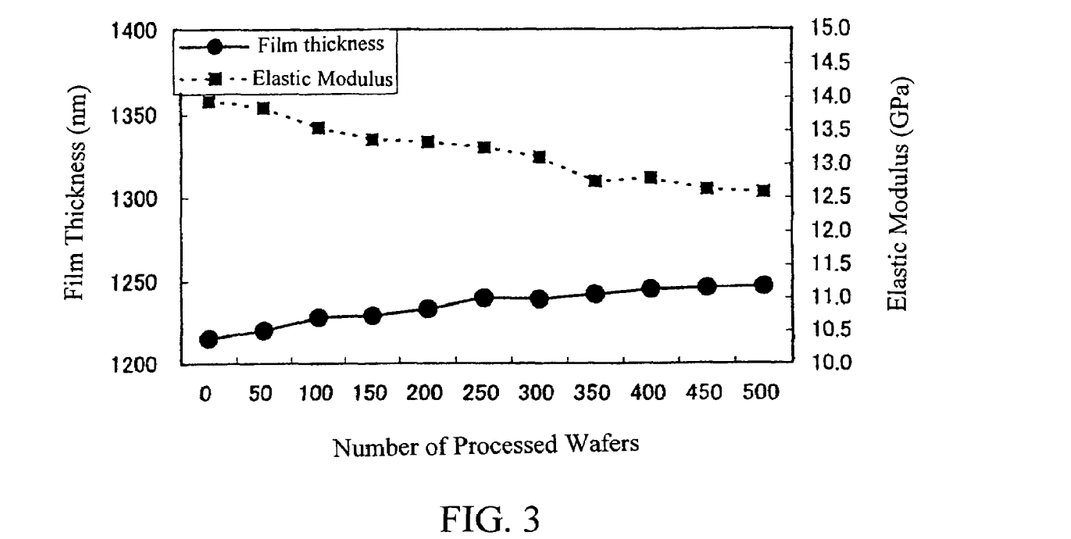
FIG. 3 is a graph showing changes in film characteristics when the consecutive deposition process is executed using the thin-film forming apparatus in Comparative Example 1.

For comparison, experiments were conducted using conventional thin-film forming apparatuses. In Experiment 1, a conventional thin-film forming apparatus (Comparative Example 1) having a showerhead in which aluminum-alloy compositions (A5052: Mg=2.2-2.8 mass %, Cr=0.15-0.35 mass %) in respective integrated surfaces of the body and the shower plate were identical was used. Experimental results are shown in FIG. 3.

Experiment 2

Figure 4:
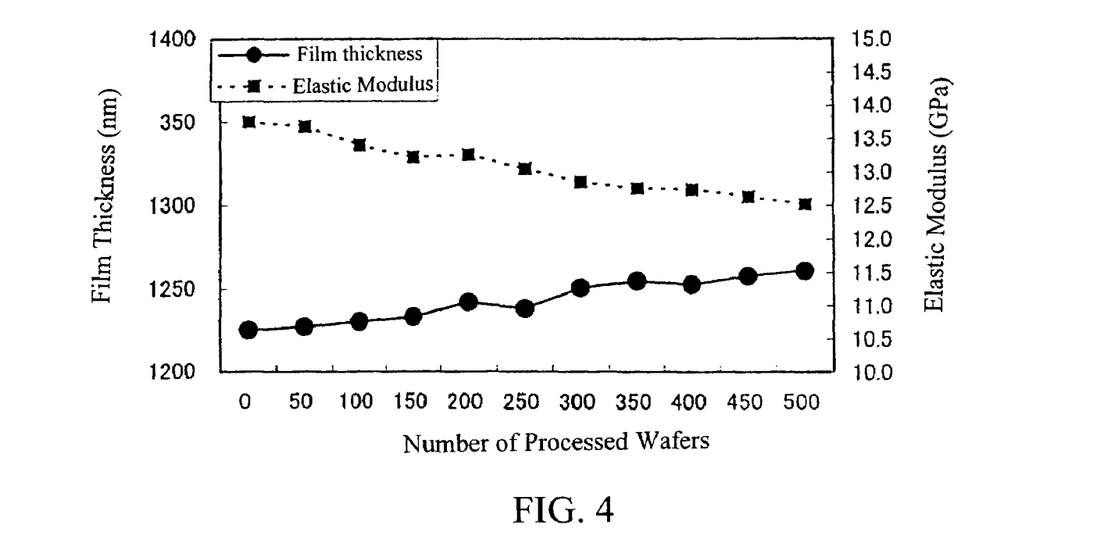
FIG. 4 is a graph showing changes in film characteristics when the consecutive deposition process is executed using the thin-film forming apparatus in Comparative Example 2.

In Experiment 2, a conventional thin-film forming apparatus (Comparative Example 2) having a showerhead in which aluminum-alloy compositions in respective integrated surfaces of the body (A6061: Mg=0.8-1.2 mass %, Si=0.40-0.8 mass %, Cu=0.15-0.40 mass %, Cr=0.04-0.35 mass %) and the shower plate (A5052: Mg=2.2-2.8 mass %, Cr=0.15-0.35 mass %) differ (magnesium composition on the body side is lower) was used. Experimental results are shown in FIG. 4.

Experiment 3

Figure 5:
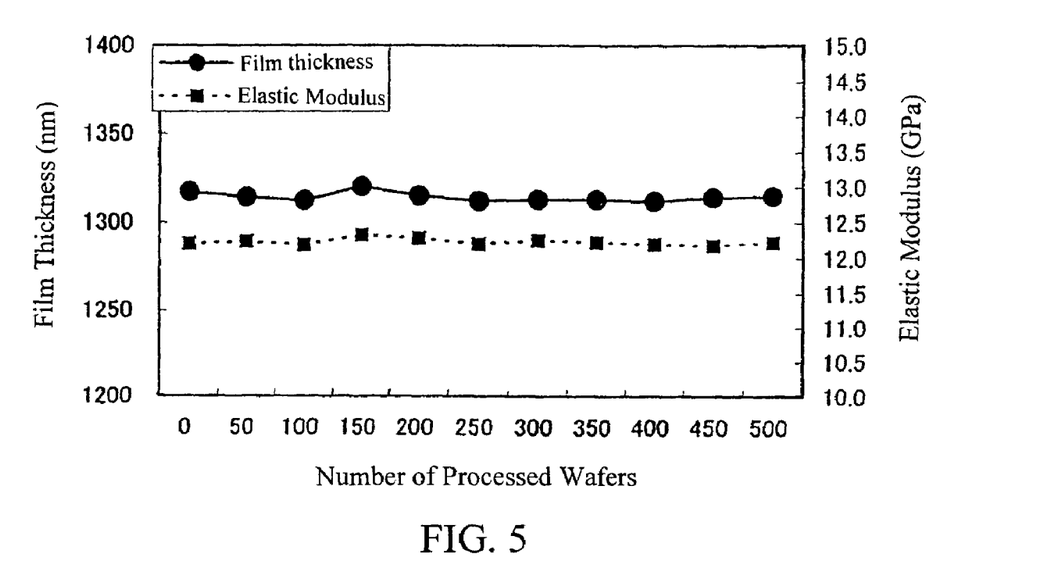
FIGS. 5 is a graph showing changes in film characteristics when the consecutive deposition process is executed using the thin-film forming apparatus in Example 1.

In Experiment 3, the thin-film forming apparatus according to an embodiment of the present invention (Example 1) in which only an integrated surface on the body side was anodized was used (the aluminum-alloy composition of the body and the shower plate were the same as in Experiment 1). In the anodic treatment, a sulfuric acid method was used, and the anodic oxide coating was a hard anodized aluminum film having a thickness of about 25 μm. Experimental results are shown in FIG. 5.

Experiment 4

Figure 6:
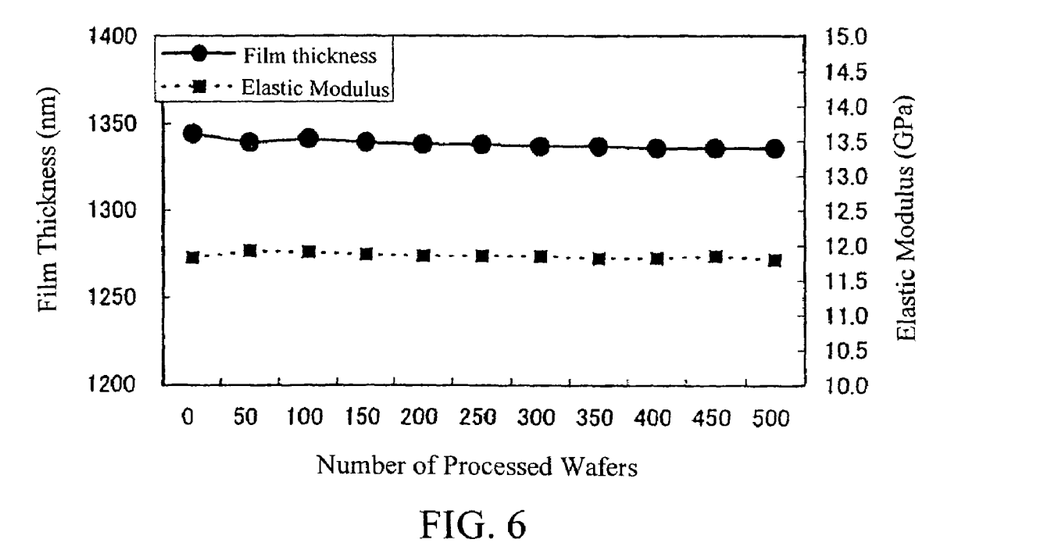
FIG. 6 is a graph showing changes in film characteristics when the consecutive deposition process is executed using the thin-film forming apparatus in Example 2.

In Experiment 4, the thin-film forming apparatus according to the present invention (Example 2) in which both integrated surfaces on the body side and on the shower-plate side were anodized was used (the aluminum-alloy composition of the body and the shower plate were the same as in Experiment 1). In the anodic treatment, a sulfuric acid method was used, and the anodic oxide coating was a hard anodized aluminum film having a thickness of about 25 μm. Experimental results are shown in FIG. 6.

Experiment 5

Figure 7:
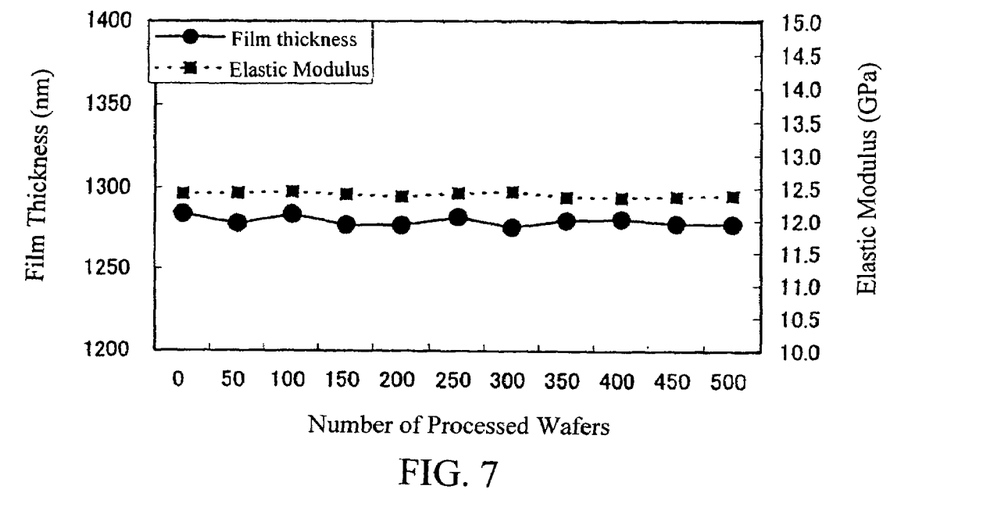
FIG. 7 is a graph showing changes in film characteristics when the consecutive deposition process is executed using the thin-film forming apparatus in Example 3.

In Experiment 5, the thin-film forming apparatus according to the present invention (Example 3) in which both integrated surfaces on the body side and on the shower-plate side were coated with aluminum fluoride was used (the aluminum-alloy composition of the body and the shower plate were the same as in Experiment 1). The aluminum fluoride coating was formed by PVD and had a thickness of about 5 μm. Experimental results are shown in FIG. 7.

Experiment 6

Figure 8:
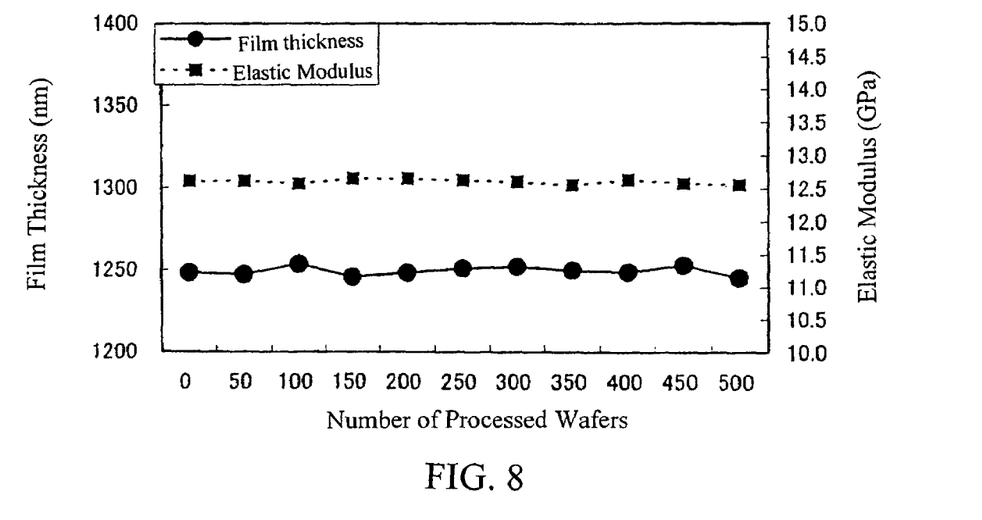
FIG. 8 is a graph showing changes in film characteristics when the consecutive deposition process is executed using the thin-film forming apparatus in Example 4.

In Experiment 6, the thin-film forming apparatus according to the present invention (Example 4) in which both integrated surfaces on the body side and on the shower-plate side were coated with titanium nitride was used (the aluminum-alloy composition of the body and the shower plate were the same as in Experiment 1). The titanium nitride coating was formed by PVD and had a thickness of about 5 μm. Experimental results are shown in FIG. 8.

Experiment Results

When seeing the results of Comparative Example 1 and Comparative Example 2, as the number of substrates deposited increased, it is seen that the film thickness gradually increased and the elastic modulus gradually lowered. Both Comparative Examples have a film thickness range of approximately 30 nm, which exceeds permissible limits. In the case of this deposition system, it has been known that, as a general rule, a film thickness becomes thinner when RF propagation worsens, and a film thickness becomes thicker when a shower-plate temperature rises. Based on the experiment results, RF propagation between the body and the shower plate was not particularly affected in Comparative Example 1 and Comparative Example 2; however, it can be conjectured that heat conduction between the two was adversely affected by corrosion. Additionally, when Comparative Example 1 and Comparative Example 2 are compared, it is thought that electrolytic corrosion slightly under way in Comparative Example 2 because a fluctuation range of film thicknesses is larger in Comparative Example 2 than in Comparative Example 1.

From the results of Embodiments 1-4, it is seen that the film thickness in every embodiment is thicker than those in Comparative Examples and that the film thickness and the elastic modulus in every embodiment remained nearly the same. In every embodiment, it is seen that a film thickness range was 10 nm or less, which remained within a permissible range, and that an elastic modulus range remained within a permissible range as well.

Further, in Examples 1-4, the impedance appears to remain small and does not hinder RF propagation from the body to the shower plate (films were formed effectively), indicating that an influence arising from the RF propagation can be ignored. Heat conduction between the body and the shower plate appears to be greatly affected by the surface treatment, and in Examples 1-4, film thicknesses are constant but greater than those in Comparative Examples, indicating that the temperature of the shower plate in Examples 1-4 was higher (low thermal conductivity).

Additionally, in Examples 1-4, film characteristics did not change even after consecutive film formation, indicating that the reaction chamber exhibited corrosive resistance to fluorinated radicals because of the integrated surfaces of the body and the shower plate, at least one of which was surface-treated.

The present application claims priority to Japanese Patent Application No. 2004-012826, filed Jan. 21, 2004, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A showerhead configured to be provided in a plasma CVD apparatus, comprising:
a cylindrical body having a hollow structure with an annular peripheral-edge surface; and
a shower plate having a number of fine pores, wherein the shower plate is detachably integrated with the body at a contact area of the peripheral-edge surface of the body, wherein the contact area is in contact with a peripheral surface of the shower plate, wherein both the body and the shower plate are constituted by substantially the same aluminum alloy,
wherein the contact area of the peripheral-edge surface of the body, rather than all other surfaces of the body, contacts the peripheral surface of the shower plate and is covered with an anodic oxide coating formed predominantly on the peripheral-edge surface relative to all other surfaces of the body, said coating being such that the coating does not prevent the passage of electric current or propagation of radio-frequency waves.

2. The showerhead according to claim 1, wherein the coating has a surface which i) has corrosion resistance to fluorinated radicals, ii) lowers thermal conductivity from the shower plate to the body, and/or iii) is made of a material different from a material constituting the body or the shower plate itself.

3. The showerhead according to claim 2, wherein the coating has a surface satisfying criteria i) through iii).

4. The showerhead according to claim 1, wherein the coating has a thickness of about 1 μm to about 100 μm.

5. A plasma CVD apparatus comprising:
a reaction chamber;
a susceptor for placing a workpiece inside the reaction chamber and for serving as an electrode for plasma discharge; and
the showerhead of claim 1 for introducing gas into the reaction chamber and for serving as another electrode for plasma discharge, said showerhead being disposed over against and substantially parallel to the susceptor inside the reaction chamber.

6. The showerhead according to claim 1, wherein the peripheral-edge surface of the body is the only area of the body covered by the anodic oxide coating.

* * * * *

UNITED STATES PATENT AND TRADEMARK OFFICE
CERTIFICATE OF CORRECTION

PATENT NO. : 7,641,761 B2  Page 1 of 1
APPLICATION NO. : 11/038888
DATED : January 5, 2010
INVENTOR(S) : Tsuji et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 560 days.

Signed and Sealed this

Twenty-first Day of December, 2010

David J. Kappos
*Director of the United States Patent and Trademark Office*